US010381073B1

(12) United States Patent
Bradshaw

(10) Patent No.: US 10,381,073 B1
(45) Date of Patent: Aug. 13, 2019

(54) CONVERGED STRUCTURE SUPPORTING BUFFERING OF RECENT WRITES AND OVERWRITE DISTURB REMEDIATION

(71) Applicant: Micron Technology, Inc., Boise, ID (US)

(72) Inventor: Samuel E. Bradshaw, Sacramento, CA (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 15/926,986

(22) Filed: Mar. 20, 2018

(51) Int. Cl.
  *G11C 13/00* (2006.01)

(52) U.S. Cl.
  CPC ........ *G11C 13/0033* (2013.01); *G11C 13/003* (2013.01); *G11C 13/0004* (2013.01); *G11C 13/004* (2013.01); *G11C 13/0061* (2013.01)

(58) Field of Classification Search
  CPC ............ G11C 13/0033; G11C 13/0004; G11C 13/004; G11C 13/003; G11C 13/0061
  See application file for complete search history.

(56) References Cited

U.S. PATENT DOCUMENTS

| 9,257,169 | B2* | 2/2016 | Jung | G11C 11/40622 |
| 9,653,176 | B2* | 5/2017 | Cai | G11C 16/3431 |
| 9,711,234 | B1* | 7/2017 | Van Gaasbeck | G11C 16/3431 |
| 9,940,991 | B2* | 4/2018 | Kim | G06F 3/0619 |
| 10,049,755 | B2* | 8/2018 | Lee | G11C 16/0483 |
| 2016/0034194 | A1* | 2/2016 | Brokhman | G06F 12/0246 |
| | | | | 711/103 |
| 2017/0269992 | A1* | 9/2017 | Bandic | G06F 11/1068 |

* cited by examiner

*Primary Examiner* — Vanthu T Nguyen
(74) *Attorney, Agent, or Firm* — Nicholson De Vos Webster & Elliott LLP

(57) ABSTRACT

A computer-implemented method for remediating disruptions to memory cells is described. The method includes writing user data to an aggressor memory cell and determining one or more of a write timestamp and an overwrite count associated with the aggressor memory cell. The write timestamp indicates a last write to the aggressor memory cell and the overwrite count indicates the number of writes to the aggressor memory cell during a time period. Based on one or more of the write timestamp and the overwrite count, an increment value is determined for use with a disturb counter associated with a neighbor memory cell of the aggressor memory cell. In particular, the determined increment value is used, in response to the write, to increment the disturb counter associated with the neighbor memory cell. When the disturb counter is greater than or equal to a disturb threshold, remediation for the neighbor memory cell is performed.

18 Claims, 8 Drawing Sheets

US 10,381,073 B1

CONVERGED STRUCTURE SUPPORTING BUFFERING OF RECENT WRITES AND OVERWRITE DISTURB REMEDIATION

FIELD OF THE INVENTION

The various embodiments described in this document relate to writes and overwrite disturb remediation, and more specifically, relate to a converged structure supporting buffering of recent writes and overwrite disturb remediation.

BACKGROUND OF THE INVENTION

Research and development of commercially viable memory devices that are randomly accessed, have relatively low power consumption, and are non-volatile is ongoing. One ongoing area of research is in resistive memory cells where resistance states can be changed. One avenue of research relates to devices that store data in memory cells by structurally or chemically changing a physical property of the memory cells in response to applied write voltages and/or current, which in turn changes cell resistance. For example, a memory controller may place a variable resistance material of a memory cell (sometimes referred to as phase change memory cells) into a crystalline phase by passing a crystallizing current through the variable resistance material, thus warming the variable resistance material of the memory cell to a temperature wherein a crystalline structure may grow. The memory controller may use a stronger melting current to melt the variable resistance material of the memory cell for subsequent cooling to the amorphous phase. The different phases of the variable resistance materials represent different binary values and allow the memory controller to write data to the memory cells.

However, writing to a memory cell may cause a write disturb phenomenon to neighbor memory cells (i.e., memory cells that are directly adjacent to a memory cell that is being written). In particular, writes to a memory cell may dissipate heat/thermal energy to neighbor memory cells. With sufficient accumulation of this heat/thermal energy from repeated writes (particularly over a relatively short period of time (e.g., 0-400 milliseconds) and/or with a high frequency), the states of neighbor memory cells are perturbed to the point that a memory controller may no longer be able to reliably determine the state of the neighbor memory cells (i.e., the memory controller may no longer be able to determine the binary value represented by a memory cell).

Further, changes to a physical property, or a phase change, of a memory cell is a transition. Within a population of memory cells, there exists a distribution of transition latencies. The tails/ends of this distribution is problematic as a clear set of read/demarcation voltages for reaching memory cells may be difficult to ascertain. Moreover, delaying accesses to accommodate the tails/ends of the distribution erodes the fundamental value proposition of phase change memory (i.e., read times may be lengthened). Consequently, writes may not only impact the ability to read neighbor memory cells (i.e., a write disturb phenomenon), but also the aggressor memory cell (i.e., resistivity drift).

BRIEF DESCRIPTION OF THE DRAWINGS

The present invention is illustrated by way of example and not limitation in the figures of the accompanying drawings, in which like references indicate similar elements, and in which.

DETAILED DESCRIPTION

Systems, methods, and devices are described herein for detecting disruptions to a phase change memory cell and determining when these disruptions are cumulatively severe enough to warrant remediation of the phase change memory cell. Embodiments include systems and methods for determining when phase change memory cells are in need of remediation as a result of writes to neighbor memory cells through the use of a set of data structures, which may also be used for fulfilling read requests for memory cells undergoing high rates of resistivity drift. In particular, in one embodiment, a drift management system and a remediation event detector use a set of hierarchical data structures for storing/buffering (1) data to fulfill read requests for user data stored in phase change memory cells (e.g., user data and parity bits associated with the user data) and (2) data to detect disruptions to other phase change memory cells (e.g., a write timestamp indicating the last time a phase change memory cell was written and/or an overwrite count indicating how many times a phase change memory cell was written during a time period). In this configuration, the drift management system may use the user data and/or parity bits to assist with read requests while phase change memory cells experience a high rate resistivity drift, whereas a remediation event detector may use the write timestamps and/or the overwrite counts to determine when multiple writes to aggressor phase change memory cells cause enough disruptions to neighbor/victim phase change memory cells to warrant remediation of the neighbor/victim phase change memory cells. As will be described in greater detail below, the set of hierarchical data structures can be configured to store a minimal amount of data while still allowing (1) the drift management system to efficiently fulfill read requests for user data while phase change memory cells are experiencing high rates of resistivity drift and (2) the remediation event detector to efficiently determine when write disruptions warrant remediation of the phase change memory cells.

Although phase change memory cells are used herein for purposes of illustration, any type of memory cells may be used in which writes to one memory cell (e.g., an aggressor memory cell) have a potentially negative effect on data or a state of another memory cell (e.g., a neighbor or victim memory cell). Accordingly, the use of phase change memory cells is used for purposes of illustration rather than limitation.

Figure 1:
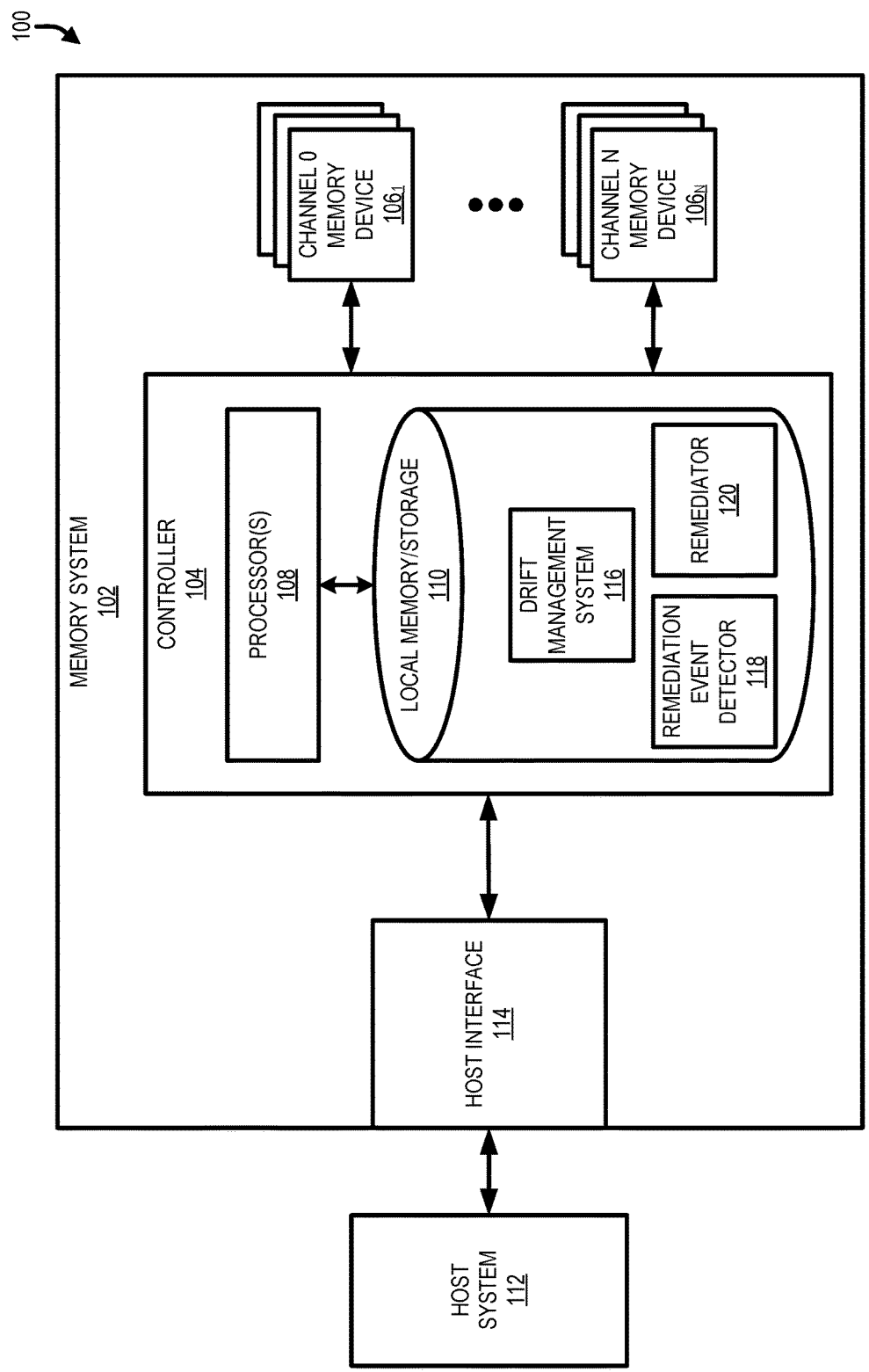
FIG. 1 is a functional block diagram of a computing system, including at least one memory system, in accordance with one or more embodiments.

FIG. 1 is a functional block diagram of a computing system 100, including at least one memory system 102, in accordance with one or more embodiments of the present disclosure. In general, the computing system 100 can include a host system 112 that uses the memory system 102. For example, the host system 112 can write data to the memory system 102 and read data from the memory system 102.

In the embodiment illustrated in FIG. 1, the memory system 102 includes a controller 104 and one or more memory devices $106_1$-$106_N$, which may correspond to separate memory channels. In this example, the controller 104 is external to the one or more memory devices $106_1$-$106_N$. The memory devices $106_1$-$106_N$ can provide a storage volume for the memory system 102 and/or the computing system 100 (e.g., the memory devices $106_1$-$106_N$ may be formatted with a particular file system for use by the computing system 100). The controller 104 includes control circuitry (e.g., hardware, firmware, and/or software) for controlling/managing the memory devices $106_1$-$106_N$. In one or more embodiments, the controller 104 is an application specific integrated circuit (ASIC) coupled to a printed circuit board, including a physical interface to the memory devices $106_1$-$106_N$. The controller 104 can utilize one or more processors 108 and/or local memory/storage 110 for use in controlling/managing the memory devices $106_1$-$106_N$. The processor 108 can be a central processing unit, microprocessor, integrated circuit, field programmable gate array, or other circuitry to read, write, and may maintain memory content as well as perform the embodiments set forth in this document and described (e.g., with reference to FIGS. 2-8).

The host system 112 can be a computing device such as a desktop computer, laptop computer, network server, mobile device, a memory card reader, an interface hub, among other host systems, and can include a memory access device (e.g., one processor (processing device) or multiple processors configured in a parallel processing system or as coprocessors). For example, in one embodiment, the computing system 100 is a personal computer and the host system 112 comprises a central processing unit that carries out the instructions of a computer program by performing the basic arithmetic, logical, control and input/output (I/O) operations specified by the instructions. One or more of these instructions may include or require access (e.g., read or write access) to user data stored in the memory devices $106_1$-$106_N$. Accordingly, the host system 112 may request access to the memory devices $106_1$-$106_N$ via commands or instructions passed to the controller 104 via the host interface 114.

The memory system 102 can include volatile memory devices, non-volatile memory devices, or a combination of volatile and non-volatile memory devices. The memory system 102 can be a storage system (e.g., solid-state drive (SSD)) to be used for data storage in the computing system 100. As a storage system, the memory system 102 can include memory devices $106_1$-$106_N$ that are non-volatile memory devices. For example, the memory devices $106_1$-$106_N$ may be a negative- and (NAND) type flash memory. Each of the memory devices $106_1$-$106_N$ can include one or more arrays of memory cells such as single level cells (SLCs), multi-level cells (MLCs), or quad-level cells (QLCs). Each of the memory cells can store bits of data (e.g., data blocks) used by the host system 112. Although non-volatile memory devices, such as NAND type flash memory, are described, the memory devices $106_1$-$106_N$ can be based on any other type of memory. For example, the memory devices $106_1$-$106_N$ can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, and electrically erasable programmable read-only memory (EEPROM).

In one embodiment, memory devices $106_1$-$106_N$ are a cross-point array of non-volatile memory cells. Cross-point non-volatile memory can perform bit storage based on a change of bulk resistance, in conjunction with a stackable cross-gridded data access array. Additionally, cross point non-volatile memory can perform a write in-place operation (in contrast to many types of Flash-based memory), where a non-volatile memory cell may be programmed without the non-volatile memory cell being previously erased.

The host system 112 is coupled to the memory system 102 via a host interface 114. In one or more embodiments, the host interface 114 is a standardized physical interface. For example, when the memory system 102 is used for data storage in the computing system 100, the host interface 114 may be a serial advanced technology attachment (SATA) interface, a peripheral component interconnect express (PCIe) interface, a universal serial bus (USB) interface, Fibre Channel, serial attached small computer system interface (SCSI) (SAS), among other standardized connectors and interfaces. The host system 112 can further utilize a non-volatile memory (NVM) Express (NVMe) interface to access the memory devices $106_1$-$106_N$ when the memory system 102 is coupled with the host system 112 by a PCIe interface. In some embodiments, the memory system 102 is a hybrid memory/storage system.

The host interface 114 can provide an interface for passing control, address, data, and other signals between the memory system 102 and the host system 112. In general, however, the host interface 114 can be comprised of any set of circuitry and protocols that provide an interface for passing control, address, data, and other signals between the memory system 102 and the host system 112.

The controller 104 communicates with the memory devices $106_1$-$106_N$ to read or write user data, among other operations. The controller 104 can have circuitry that includes one or more integrated circuits, discrete components, and/or code/instructions for managing/controlling the memory devices $106_1$-$106_N$. For example, the local memory/storage 110 can include the drift management system 116, which, as will be described in greater detail below, includes or can use hierarchical data structures and/or logic for accessing the memory devices $106_1$-$106_N$ in an efficient matter by caching/storing user data and/or parity bits (sometimes referred to as error correction codes (ECCs)) for user data stored in the memory devices $106_1$-$106_N$. In the above example embodiment or in a separate example embodiment, the local memory/storage 110 can include a remediation event detector 118 and a remediator 120. As will be described in greater detail below, the remediation event detector 118 may include or may use the set of data structures and/or logic for determining when the degree of disturbance caused by writes to neighbor memory cells of a memory device $106_1$-$106_N$ requires remediation by the remediator 120 to ensure data stored in the disturbed memory cell is preserved. The controller 104 couples to a connection/interface of each memory device $106_1$-$106_N$ to receive or transmit the appropriate signal at the appropriate time to carry out an operation (e.g., reading or writing user data). In some embodiments, the communication protocol between the host system 112 and the memory system 102 is different than the protocol used by the controller 104 for access of a memory device $106_1$-$106_N$. In these embodiments, the controller 104 may translate the commands/signals received from the host system 112 into the appropriate commands/signals to achieve the desired access to a memory device $106_1$-$106_N$. In some embodiments, drift management system 116, the remediation event detector 118 and/or the remediator 120 are external to the controller 104.

Each memory device $106_1$-$106_N$ can include one or more arrays of memory cells (e.g., non-volatile memory cells). The memory cells can be grouped. As used herein, a group can include one or more memory cells, such as a page, block, plane, die, an entire array, or other groups of memory cells. For example, some memory arrays can include a number of pages of memory cells that make up a block of memory cells. A number of blocks can be included in a plane of memory cells. A number of planes of memory cells can be included on a die. As an example, a 128 GB memory device can include 4314 bytes of data per page, 128 pages per block, 2048 blocks per plane, and 16 planes per device. Sets of memory cells in a memory device 106 can be referenced using an assigned address. In particular, an address may be assigned to one or more memory cells in a memory device 106 such that the address may be used for accessing the corresponding memory cells (e.g., reading the one or more memory cells or writing to the one or more memory cells).

A group of memory cells in a memory device 106 may be used for storing ECC protected user data (e.g., codewords). For example, each memory cell in a memory device 106 can be used for storing a single bit of user data. In some embodiments, the user data stored in the memory devices $106_1$-$106_N$ include or are stored along with parity bits that are used to correct for errors introduced while the user data is stored in the memory devices $106_1$-$106_N$ and/or while the user data is being read from the memory devices $106_1$-$106_N$. For example, the errors may be caused by the noise experienced by the memory devices $106_1$-$106_N$ (e.g., electromagnetic radiation), which causes bits to be flipped in the memory devices $106_1$-$106_N$ and/or errors caused by reading (e.g., using an improper read/demarcation voltage).

The memory devices $106_1$-$106_N$ may be resistance memory devices such that each of the memory cells that make up a memory device 106 is a resistance memory cell. For example, each memory device $106_1$-$106_N$ can represent a die providing three-dimensional phase change material and switching (PCMS) memory. In such an embodiment, each of the memory cells of the memory devices $106_1$-$106_N$ is a phase change memory cell.

Figure 2:
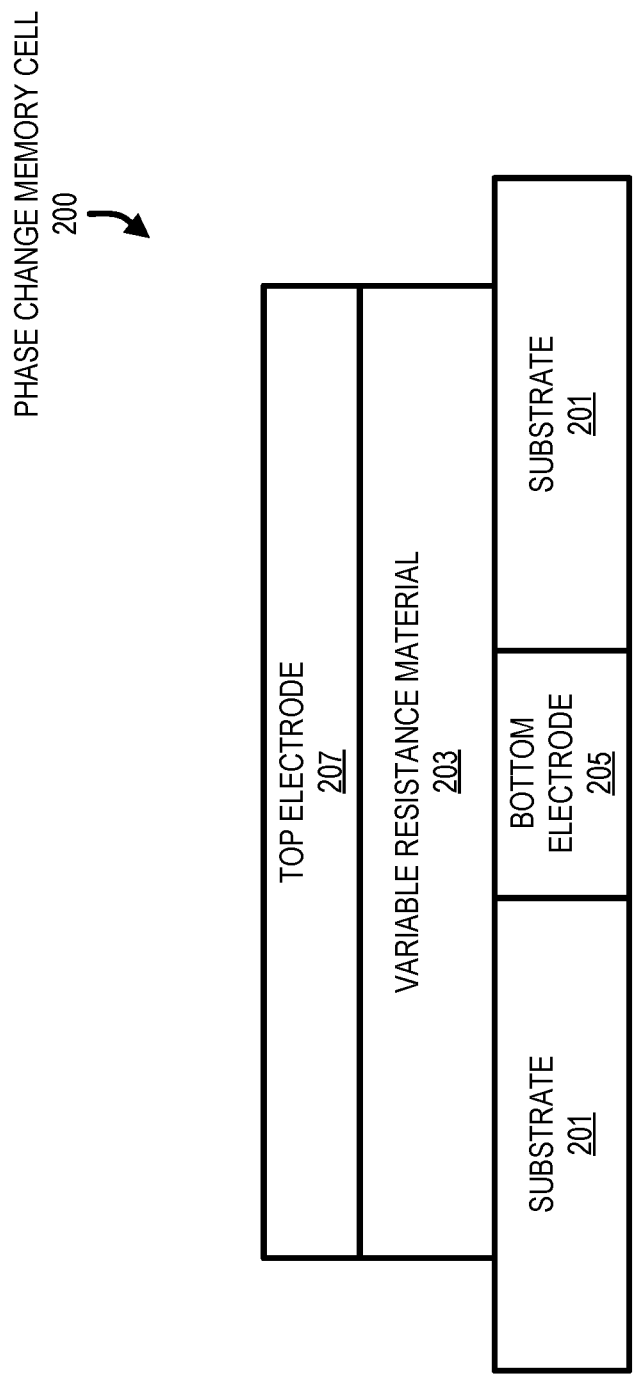
FIG. 2 shows a basic composition of a phase change memory cell constructed over a substrate, having a variable resistance material formed between a bottom electrode and a top electrode, in accordance with one or more embodiments.

FIG. 2 shows a basic composition of a phase change memory cell 200 (e.g., in a memory device $106_1$-$106_N$) constructed over a substrate 201, having a variable resistance material 203 formed between a bottom electrode 205 and a top electrode 207, in accordance with some embodiments of the present disclosure. One type of variable resistance material 203 can be amorphous silicon doped with V, Co, Ni, Pd, Fe and Mn. Another type of variable resistance material 203 can include perovskite materials such as Pr(1-x)CaxMnO3 (PCMO), La(1-xCaxMnO3(LCMO), LaSrMnO3 (LSMO), or GdBaCoxOy (GBCO). Still another type of variable resistance material 203 can be a doped chalcogenide glass of the formula AxBy, where B is selected from among S, Se and Te and mixtures thereof, and where A includes at least one element from Group III-A (B, Al, Ga, In, Tl), Group IV-A (C, Si, Ge, Sn, Pb), Group V-A (N, P, As, Sb, Bi), or Group VII-A (F, Cl, Br, I, At) of the periodic table, and with the dopant being selected from among the noble metals and transition metals, including Ag, Au, Pt, Cu, Cd, Ir, Ru, Co, Cr, Mn or Ni. Yet another type of variable resistance material 203 includes a carbon-polymer film comprising carbon black particulates or graphite, for example, mixed into a plastic polymer. The material used to form the illustrated bottom and top electrodes 205 and 207 may be selected from a variety of conductive materials, such as tungsten, nickel, tantalum, titanium, titanium nitride, aluminum, platinum, or silver, among others.

The variable resistance material 203 can be in an amorphous phase or a crystalline phase. The resistance of the variable resistance material 203 is different when in the amorphous phase in comparison to when in the crystalline phase. In particular, the variable resistance material 203 has a higher resistivity when in the amorphous phase than when in the crystalline phase. As described herein, the phase of the variable resistance material 203 and by extension the resistivity of the variable resistance material 203 may be equated, linked, or otherwise associated with a binary value. In one example embodiment, the amorphous phase with a first resistivity (or first resistivity range) corresponds to a binary value of "0" or False (i.e., a reset/unset state) and the crystalline phase with a second resistivity (or second resistivity range) corresponds to a binary value of "1" or True (i.e., a set state). In other embodiments, the association between phases/resistivity of the variable resistance material 203 and binary values can be switched/flipped.

Although the variable resistance material 203 has been described as having only two phases (e.g., an amorphous phase and a crystalline phase), in other embodiments, the variable resistance material 203 can have more than two phases. For example, the variable resistance material 203 can have a single amorphous phase and two crystalline phases (e.g., cubic and hexagonal crystalline phases). For purposes of explanation, the variable resistance material 203 will be described in relation to two phases (e.g., an amorphous phase and a crystalline phase); however, the systems, methods, and devices described herein may operate similarly when the variable resistance material 203 has more than two phases.

The transition from one phase to another phase (e.g., from the amorphous phase to the crystalline phase or from the crystalline phase to the amorphous phase) occurs in response to temperature changes of the variable resistance material 203. The temperature changes (i.e., heating and cooling) may be caused by passing differing strengths of current through the variable resistance material 203. For example, the electrodes 205 and 207 can place the variable resistance material 203 in a crystalline phase by passing a crystallizing current through the variable resistance material 203, thus warming the variable resistance material 203 to a temperature wherein a crystalline structure may grow. The electrodes 205 and 207 can use a stronger melting current to melt the variable resistance material 203 for subsequent cooling to the amorphous phase. When the phase change memory cell 200 uses the crystalline phase to represent a binary value of "1" or True and the amorphous phase to represent a binary value of "0" or False, the crystallizing current can be referred to as a write or set current and the melting current can be referred to as an erase or reset current. However, as described above, the assignment of phases to binary values can be switched.

In one embodiment, the memory system 102 uses the electrodes 205 and 207 for determining a phase of the variable resistance material 203 and thus determine a binary value represented by the current phase of the variable resistance material 203. For example, the electrodes 205 and 207 can be coupled to a selector and the selector can act as a switch to selectively allow a variable voltage across the variable resistance material 203. When the resistivity of the variable resistance material 203 is high (i.e., the variable resistance material 203 is in an amorphous phase), the voltage used must be sufficiently high to overcome the resistivity of the variable resistance material 203. If the voltage is not sufficiently high, current will not pass through the variable resistance material 203 and the selector will snap back open. In contrast, when the variable resistance material 203 has a lower resistivity (e.g., the variable resistance material 203 is in a crystalline phase), the same voltage that was not able to pass through the variable resistance material 203 when at a higher resistivity (e.g., the variable resistance material 203 is in the amorphous phase) will pass through the variable resistance material 203 without snapping the selector back open (i.e., the selector remains closed). Thus, applying a current with a specific voltage allows the phase of the variable resistance material 203 to be determined such that data stored in or represented by the variable resistance material 203 can be read.

Although the variable resistance material 203 of a phase change memory cell 200 is described above as being in one phase or another (e.g., metastable in an amorphous phase or a crystalline phase) and having a discrete resistivity while in that corresponding phase, the resistivity of the variable resistance material 203 may be in constant transition or may be constantly drifting. Namely, the resistivity of the variable resistance material 203 may vary (i.e., decelerate) over time as it attempts to settle. The rate of the change is highest when the variable resistance material 203 is initially written to a particular phase and the rate of change is reduced over time until a constant rate of resistivity change is reached. The rate of resistivity change can be dependent on the phase of the variable resistance material 203. For example, when the variable resistance material 203 of a phase change memory cell 200 is in the crystalline phase (i.e., the phase change memory cell 200 is set) the rate of resistivity change can be higher than when the variable resistance material 203 is in the amorphous phase (i.e., the phase change memory cell 200 is reset/unset).

Accordingly, the voltage applied by a selector of the phase change memory cell 200 may need to be time-dependent (i.e., relative to the time from when the phase change memory cell 200 was last written) to allow the phase of the variable resistance material 203 to be determined while the resistivity of the variable resistance material 203 is drifting. For example, three different voltage levels can be used to determine/read the phase of the variable resistance material 203, where each voltage level corresponds to a different time frame from when the variable resistance material 203 was last written. For example, a first voltage level can correspond to the time immediately after the variable resistance material 203 was last written (i.e., time zero) until one-hundred seconds has elapsed, a second voltage level can correspond to one-hundred seconds until twelve hours has elapsed, and a third voltage level can correspond to twelve hours and onward. The time ranges/periods may be different than the examples set forth in this document and/or may be adjusted. In some embodiments, the lowest voltage level is used initially to reduce the probability that a read operation will affect the phase of the variable resistance material 203. In particular, as noted above, the variable resistance material 203 can be coupled to a selector that is itself made from phase change material. Accordingly, the selector drifts in a similar fashion as the coupled variable resistance material 203. Increasing voltages with time is required to reach the threshold of this selector. However, increasing voltages also increases the current going through the variable resistance material 203 and thus the amount of heat the variable resistance material 203 receives. With a high enough voltage and with repetition, this can alter the state of the variable resistance material 203. The altered state can have a resistance that is indistinguishable as set or reset. As a result, a gentle approach is taken in which re-reads are performed with elevated voltages. If the controller 104 detects a valid codeword based on reading a set of phase change memory cells 200 (e.g., utilizing a decoder and parity bits stored in the set of phase change memory cells 200), re-reads of the phase change memory cells 200 with other voltage levels are not necessary. However, if a valid codeword is not determined, the next lowest/higher voltage level is utilized. This pattern continues until either a valid codeword is determined (utilizing parity bits were appropriate) or the voltage levels are exhausted without producing a valid codeword.

Figure 3:
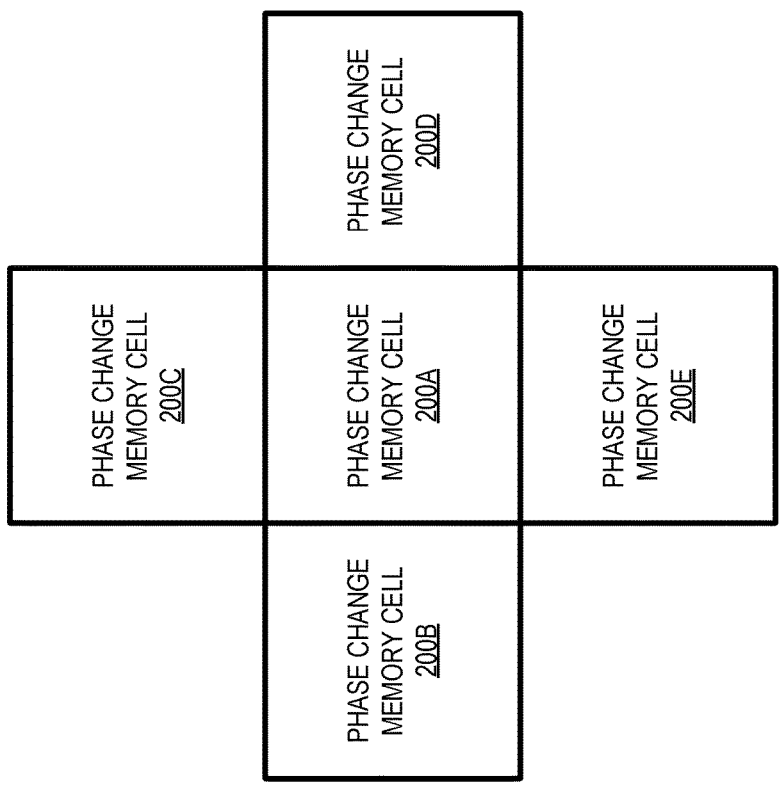
FIG. 3 shows an overhead view of a set of phase change memory cells in a memory device, in accordance with one or more embodiments.

FIG. 3 shows an overhead view of a set of phase change memory cells 200A-200E in a memory device $106_1$, in accordance with some embodiments of the present disclosure. As used herein, a first phase change memory cell 200 is neighboring a second phase change memory cell 200 when the first and second phase change memory cells 200 are directly adjacent and/or there are no intermediate phase change memory cells 200 between the first and second phase change memory cells 200. For example, as shown in FIG. 3, the phase change memory cells 200B-200E may be considered adjacent or neighbors to phase change memory cell 200A, as there are no other phase change memory cells 200 between each of the phase change memory cells 200B-200E and the phase change memory cell 200A. Although shown in a two-dimensional representation, a neighboring relationship between phase change memory cells 200 may also be present in three-dimensions (i.e., phase change memory cells 200 are stacked along separate planes).

Although the controller 104 may be writing to a particular phase change memory cell 200, effects from a write operation may be felt by neighbor phase change memory cells 200. For example, the controller 104 may apply a crystallizing current through the variable resistance material 203 of the phase change memory cell 200A, thus warming the variable resistance material 203 to a temperature wherein a crystalline structure may grow. Heat/thermal energy from this write operation of the phase change memory cell 200A (the aggressor phase change memory cell 200A) may naturally dissipate or flow to one or more of the neighbor phase change memory cells 200B-200E (victim phase change memory cells 200B-200E). With sufficient accumulation of this heat/thermal energy from repeated writes (particularly over a relatively short period of time (e.g., 0-400 milliseconds)), the state/phase of the neighbor phase change memory cells 200B-200E may be perturbed to the point that the controller 104 may no longer be able to reliably determine the state of the neighbor phase change memory cells 200B-200E (i.e., the controller 104 may no longer be able to determine the binary value represented by one or more of the phase change memory cells 200B-200E even with associated parity bits). To correct for disturbances to neighbor phase change memory cells 200B-200E, a remediation technique may be performed. As will be described in greater detail below, remediation may include selectively rewriting/refreshing the state of neighbor phase change memory cells 200B-200E when the disturbance reaches a disturb threshold.

Figure 4:
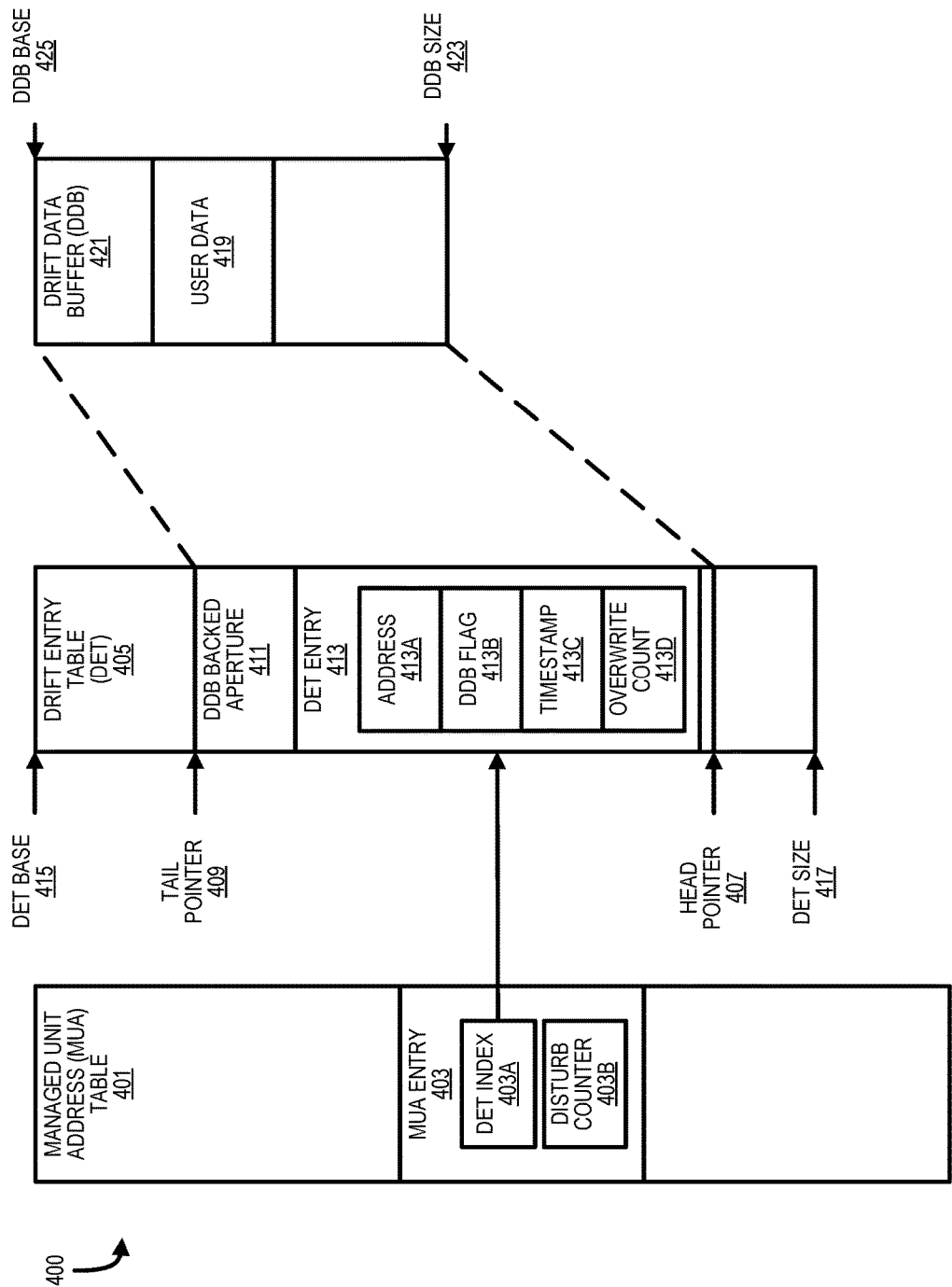
FIG. 4 shows a set of hierarchical data structures for accessing data from phase change memory cells and determining when remediation of phase change memory cells is warranted, in accordance with one or more embodiments.

The remediation event detector 118 determines when the disturbance to a phase change memory cell 200 has reached the disturb threshold such that the remediator 120 can take action. In one embodiment, the remediation event detector 118 determines the disturbance level to a phase change memory cell 200 based on a disturb counter. For example, FIG. 4 shows a set of hierarchical data structures 400 that can be used by the remediation event detector 118 to determine when effects to phase change memory cell 200A caused by writes to neighbor phase change memory cells 200B-200E have reached a disturb threshold (e.g., heat/thermal energy from writes to phase change memory cells 200B-200E has been absorbed by the phase change memory cell 200A and has altered the phase of the phase change memory cell 200A). In addition to determining disturbances to phase change memory cells 200, the hierarchical data structures 400 may also assist in the reading of data from phase change memory cells 200 while the phase change memory cells 200 undergo continual resistivity drift.

The hierarchical data structures 400 are comprised of a set of first-in-first-out buffers that can be stored in the local memory/storage 110 or any other location in the controller 104. In particular, as shown in FIG. 4, the hierarchical data structures 400 includes a Managed Unit Address (MUA) table 401. The MUA table 401 can be used for indicating the location of data in a memory hierarchy and/or for determining when effects to phase change memory cells 200 caused by writes to neighbor phase change memory cells 200 have reached a disturb threshold. In one embodiment, the MUA table 401 includes MUA entries 403 corresponding to different phase change memory cells 200 or groups of phase change memory cells 200. In one embodiment, the drift management system 116 or another component of the local memory/storage 110 indexes the MUA entries 403 based on an address of the phase change memory cells 200 (e.g., indexed based on MUA addresses for the phase change memory cells 200). Although described as indexing based on a MUA address, the MUA entries 403 can be indexed using a logical index rather than physical index. In particular, an access request from a host system 112 can provide a logical address. The controller 104 uses the logical address to index the MUA table 401 (e.g., the memory system 102 may function to provide address translation). For example, the controller 104, via the MUA table 401, may identity map that logical address to a physical address (i.e., a phase change memory cells 200 in the topology) or the controller 104 may redirect that logical address to some non-identity mapped address for a phase change memory cell 200, supporting indirection between logical and physical.

The MUA table 401 references or points to a Drift Entry Table (DET) 405. For example, the MUA table 401 may include data corresponding to a head pointer 407 and a tail pointer 409 of a Drift Data Buffer (DDB) backed aperture 411 in the DET 405 (i.e., the in-use portion of the DET 405). Further, each of the MUA entries 403 may include a DET index 403A and a disturb counter 403B. In one embodiment, the DET index 403A of a MUA entry 403 is an offset (e.g., a pointer) to a DET entry 413 in the DDB backed aperture 411 of the DET 405 and the disturb counter 403B indicates the level/degree of disturbance experienced by an associated phase change memory cell 200. A MUA entry 403 may have a DET index 403A if a phase change memory cell 200 corresponding to the MUA entry 403 was written within a specified time period (e.g., within four-hundred milliseconds since the phase change memory cell 200 has been written). Each DET index 403A points to a single DET entry 413 such that the DET indices 403A and the DET entries 413 share a one-to-one relationship.

Each DET entry 413 may include various pieces of data. For example, in some embodiments, each DET entry 413 includes one or more of an address 413A (e.g., an MUA address corresponding to the MUA entry 403 and consequently the phase change memory cells 200 associated with the MUA entry 403); a DDB flag 413B indicating whether user data 419 associated with the phase change memory cells 200 have been stored/cached in the hierarchical data structures 400 (e.g., when the DDB flag 413B is set to true, user data 419 for the associated phase change memory cells 200 is stored/cached in the hierarchical data structures 400); a write timestamp 413C indicating when the associated phase change memory cells 200 were last written for use in determining disturbance effects to the phase change memory cells 200 relative to time; and an overwrite count 413D indicating the number of times associated phase change memory cells 200 have been overwritten while the corresponding DET entry 413 is in the DET for use in determining portions of the memory devices 106 that have been heavily overwritten and may develop excessive wear or hotspots.

As noted above, the MUA table 401 can include data corresponding to a head pointer 407 and a tail pointer 409 of the DDB backed aperture 411. In particular, although the DET 405 can have a DET base 415 and a DET size 417 that may be fixed, the used portion of the DET 405 (i.e., the portion of the DET 405 that is being referenced by MUA entries 403 in the MUA table 401 and corresponds to the DDB backed aperture 411) can vary. Specifically, as noted above, MUA entries 403 can only have DET indices 403A when corresponding phase change memory cells 200 have been recently written. Thus, when the memory system 102 first turns-on and/or a corresponding host system 112 first boots, the phase change memory cells 200 may all have been written outside a relevant window of interest. Thus, the DET 405, and in particular the DDB backed aperture 411, may be empty.

As shown in FIG. 4, the data corresponding to the head pointer 407 can be a pointer corresponding to the beginning of the DDB backed aperture 411 in the DET 405 and the data corresponding to the tail pointer 409 can be a pointer corresponding to the end of the DDB backed aperture 411 in the DET 405. In one embodiment, the head pointer 407 references an unused DET entry 413 whereas the tail pointer 409 references a used DET entry 413 (with the exception when the DET 405 is empty and the tail pointer 409 must reference an unused DET entry 413). When the DET 405, and in particular the DDB backed aperture 411, is empty, the head pointer 407 and the tail pointer 409 are equal and reference the first DET entry 413. Updates to the head pointer 407 and the tail pointer 409 can be made modulus the DET size 417 to ensure the head pointer 407 and the tail pointer 409 remain in the range of the DET 405.

The DET 405, and accordingly the DDB backed aperture 411, is considered full when the difference between the head pointer 407 and the tail pointer 409 is equal to one less than the DET size 417. Based on this correspondence, the DET size 417 may be a power of two for optimization (i.e., produces optimized results for modulus/divide operations as the modulus/divide operation may be performed using a shift operation); however, in other embodiments, the DET size 417 may be of different sizes not tied to a power of two. The DET 405 will likely remain in a full state constantly as DET entries 413 will quickly fill the DET 405 as the controller 104 writes phase change memory cells 200 and constantly replaces DET entries 413 as time elapses and/or capacity of the DET 405 is reached (i.e., the number of DET entries 413 in the DET 405 reaches the DET size 417).

As noted above, the in-use portion of the DET 405 (i.e., the DET entries 413 between the head pointer 407 and the tail pointer 409) may be termed the DDB backed aperture 411. Each DET entry 413 can be related/associated with user data 419 in the DDB 421 as designated by a DDB offset. For example, the DDB offset (i.e., the location for user data 419 in the DDB 421) can be equal to the DET offset for the DET entry 413 modulus the DDB size 423 (i.e., the size of the DDB 421). In this example embodiment, the head or beginning of the DDB 421 is located at the DDB base 425 and the DDB 421 has a number of pieces of user data 419 equal to the DDB size 423.

The hierarchical data structures 400 can be variably sized based on the stability of the of phase change memory cells 200 of the memory devices 106. For example, the DDB 421 can be sized to always buffer user data 419 for the last one-hundred milliseconds of data writes to the memory devices 106. At one gigabyte per second write rates, the DDB 421 would have to total one-hundred megabytes or roughly twenty-five thousand user data 419 entries of four kilobytes each. Power-of-two optimizations might increase this to 32,768 user data 419 entries (i.e., $2^{15}$). Furthermore, one embodiment includes buffering four-hundred milliseconds worth of write timestamps 413C and overwrite counts 413D in the DET 405 (i.e., write timestamps 413C and overwrite counts 413D for the phase change memory cells 200 written in the last four-hundred milliseconds). At four kilobytes of granularity and one gigabyte per second write rates, the DET 405 would need to hold approximately 100,000 DET entries 413. Power-of-two optimization might increase the number of DET entries 413 to 131,027 (i.e., $2^{17}$). To account for this number of DET entries 413 in the DET 405, the DET index 403A would have to be at least a seventeen-bit pointer to fully address every DET entry 413.

When a set of phase change memory cells 200 are written, the drift management system 116 may add a DET entry 413 to the DET 405. Additions of new DET entries 413 occur under three situations: (1) a DET entry 413 is being added to a non-full DET 405 (no overwriting necessary as the DET 405 is not full); (2) a DET entry 413 is being added to a full DET 405, but an existing DET entry 413 will not be overwritten; and (3) a DET entry 413 is being added to a full DET 405 and an existing DET entry 413 will be overwritten. In each situation, user data 419 is written to the memory devices $106_1$-$106_N$ (e.g., the phase change memory cells 200) simultaneous with the user data 419 being processed by the drift management system 116. Each of the three situations listed above for adding DET entries 413 will be described below.

With respect to adding a DET entry 413 to a non-full DET 405 without overwrite, the process can commence with indexing the MUA table 401 based on an address of the phase change memory cells 200 being written to locate the corresponding MUA entry 403. In this scenario, the located MUA entry 403 does not have an associated DET index 403A, which indicates that the phase change memory cells 200 corresponding to the MUA entry 403 do not have a corresponding DET entry 413. Accordingly, the DET entry 413 indicated by the head pointer 407 can be used for the DET index 403A. Based on this DET entry 413, the location for user data 419 in the DDB 421 can be determined as described above (e.g., the DDB offset for the user data 419 in the DDB 421 may be equal to the DET offset for the DET entry 413 modulus the DDB size 423). The user data 419 from the write operation that precipitated this new MUA entry 403 can thereafter be written to the determined location in the DDB 421. Subsequently, the fields of the DET entry 413 can be set, including setting the DDB flag 413B to one/True, setting the write timestamp 413C to the current time, and setting the overwrite count 413D to zero. As noted above, the DET index 403A for the MUA entry 403 can be set to the head pointer 407 and the head pointer 407 can be incremented to a new DET entry 413.

With respect to adding a DET entry 413 to a full DET 405 without overwriting a MUA entry 403, the process can commence with indexing the MUA table 401 based on an address of the phase change memory cells 200 being written to locate the corresponding MUA entry 403. In this scenario, the located MUA entry 403 does not have an associated DET index 403A, which indicates that the phase change memory cells 200 corresponding to the MUA entry 403 do not have a corresponding DET entry 413. Accordingly, the DET entry 413 indicated by the head pointer 407 can be used for the DET index 403A of the previously located MUA entry 403. Since the DET 405 is full, the MUA entry 403 referencing the used DET entry 413 can have its DET index 403A cleared such that the DET entry 413 previously referenced by the DET index 403A is now free to use. The DET entry 413 indicated by the tail pointer 409 is identified and its DDB flag 413B is cleared. The tail pointer 409 is thereafter incremented to point to the next DET entry 413. The location in the DDB 421 indicated by the head pointer 407, which is the same location indicated by the tail pointer 409 before being incremented, is identified. The user data 419 from the write operation that precipitated this new MUA entry 403 can be written to the identified location in the DDB 421. Subsequently, the fields of the DET entry 413 can be set, including setting the DDB flag 413B to one/True, setting the write timestamp 413C to the current time, and setting the overwrite count 413D to zero. As noted above, the DET index 403A for the MUA entry 403 can be set to the head pointer 407 and the head pointer 407 can be incremented to a new DET entry 413.

With respect to adding a DET entry 413 to a full DET 405 and overwriting a MUA entry 403, the process can commence with indexing the MUA table 401 based on an address of the phase change memory cells 200 being written to locate the corresponding MUA entry 403. In this scenario, the located MUA entry 403 does have an associated DET index 403A, which indicates that the phase change memory cells 200 corresponding to the MUA entry 403 have a corresponding DET entry 413. Based on this DET index 403A, the DET entry 413 can be located, the overwrite count 413D associated with the DET entry 413 can be captured and the DET entry 413 can be re-initialized to be empty. The DET entry 413 indicated by the head pointer 407 may now be used for the DET index 403A. Since the DET 405 is full, the MUA entry 403 referencing the used DET entry 413 can have its DET index 403A cleared such that the DET entry 413 previously referenced by the DET index 403A is now free to use. The DET entry 413 indicated by the tail pointer 409 is identified and its DDB flag 413B is cleared. The tail pointer 409 is thereafter incremented to point to the next DET entry 413. The location in the DDB 421 indicated by the head pointer 407, which is the same location indicated by the tail pointer 409 before being incremented, is identified. The user data 419 from the write operation that precipitated this new MUA entry 403 can be written to the identified location in the DDB 421. Subsequently, the fields of the DET entry 413 can be set, including setting the DDB flag 413B to one/True, setting the write timestamp 413C to the current time, and the overwrite count 413D can be set to the previously captured value and incremented by one. As noted above, the DET index 403A for the MUA entry 403 can be set to the head pointer 407 and the head pointer 407 can be incremented to a new DET entry 413.

Figure 5:
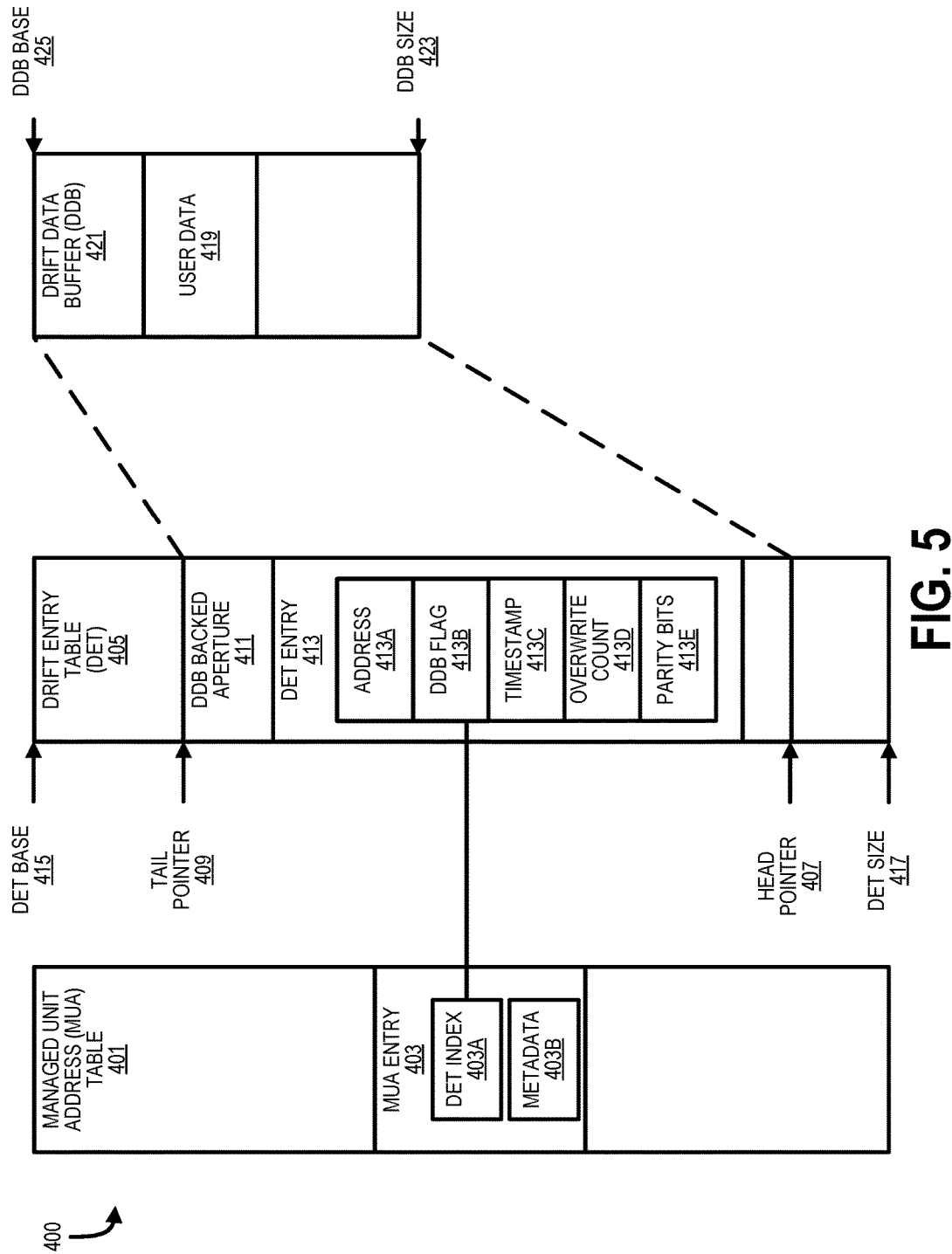
FIG. 5 shows a set of hierarchical data structures for accessing data from phase change memory cells, including parity bits stored in a drift entry table, and determining when remediation of phase change memory cells is warranted, in accordance with one or more embodiments.
Figure 6:
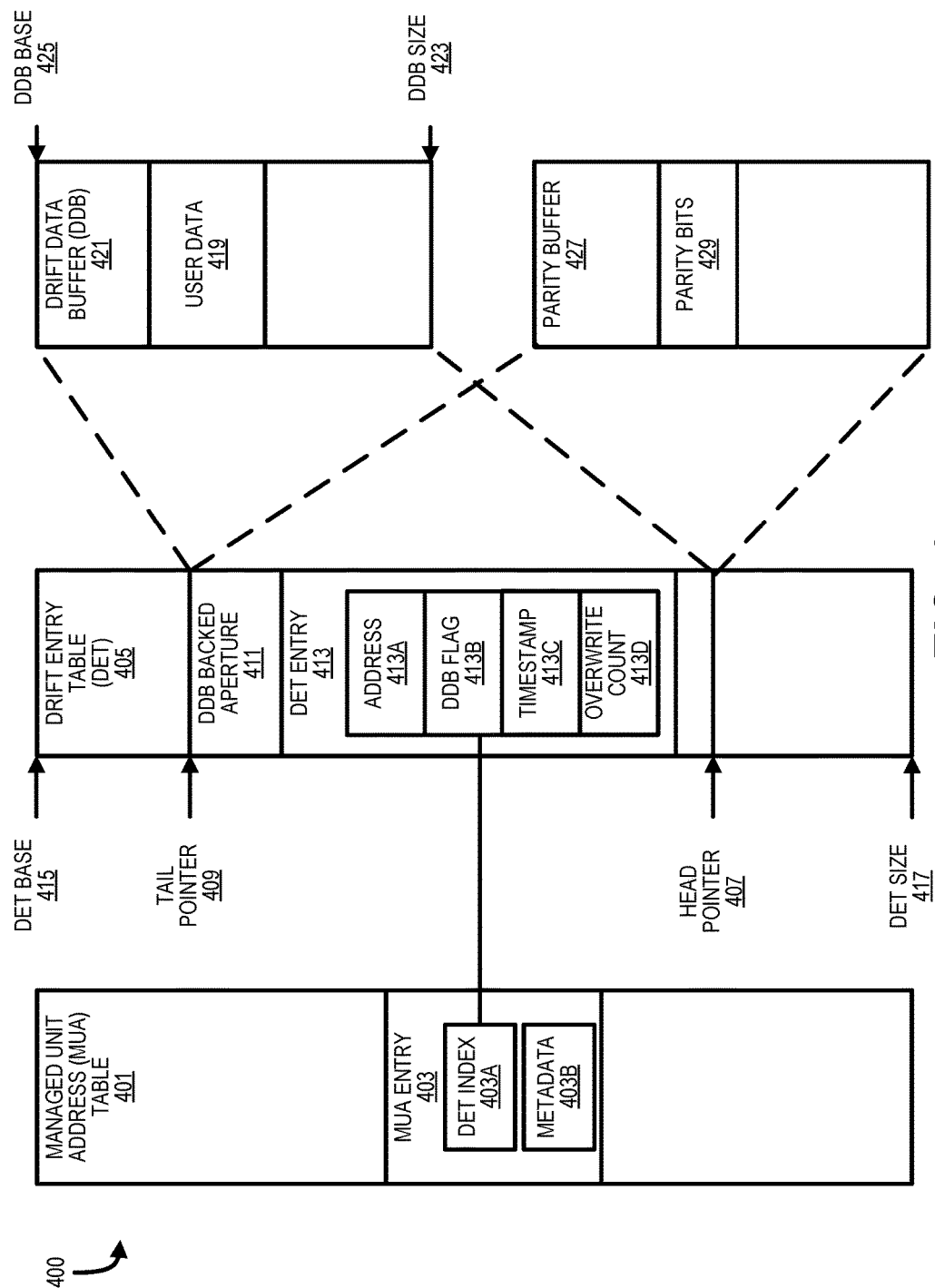
FIG. 6 shows a set of hierarchical data structures for accessing data from phase change memory cells, including parity bits stored in a parity buffer, and determining when remediation of phase change memory cells is warranted, in accordance with one or more embodiments.

Although the set of hierarchical data structures 400 has been described according to the specific embodiment shown in FIG. 4, the set of hierarchical data structures 400 may include different elements in other embodiments. For example, although parity bits for the user data 419 may be located in the MUA table 401, the parity bits for the user data 419, which are stored separate from the user data 419 and provide stronger error correction than parity bits stored with the user data 419 in the phase change memory cells 200, may be stored in any location outside the phase change memory cells 200. For example, FIG. 5 shows an embodiment in which the parity bits are stored in the DET 405. In particular, each DET entry 413 includes parity bits 413E. In another embodiment, the parity bits for the user data 419 may be stored in another data structure of the hierarchical data structures 400 (separate from the MUA table 401, the DET 405, and DDB 421). For example, as shown in FIG. 6, the parity bits 429 are present in a parity buffer 427 and can be accessed based on a corresponding offset relative to a DET entry 413 (e.g., in a similar fashion as the user data 419 is accessed from the DDB 421). Accordingly, as shown in FIGS. 4-6, the set of hierarchical data structures 400 are not limited to a specific configuration.

Figure 7:
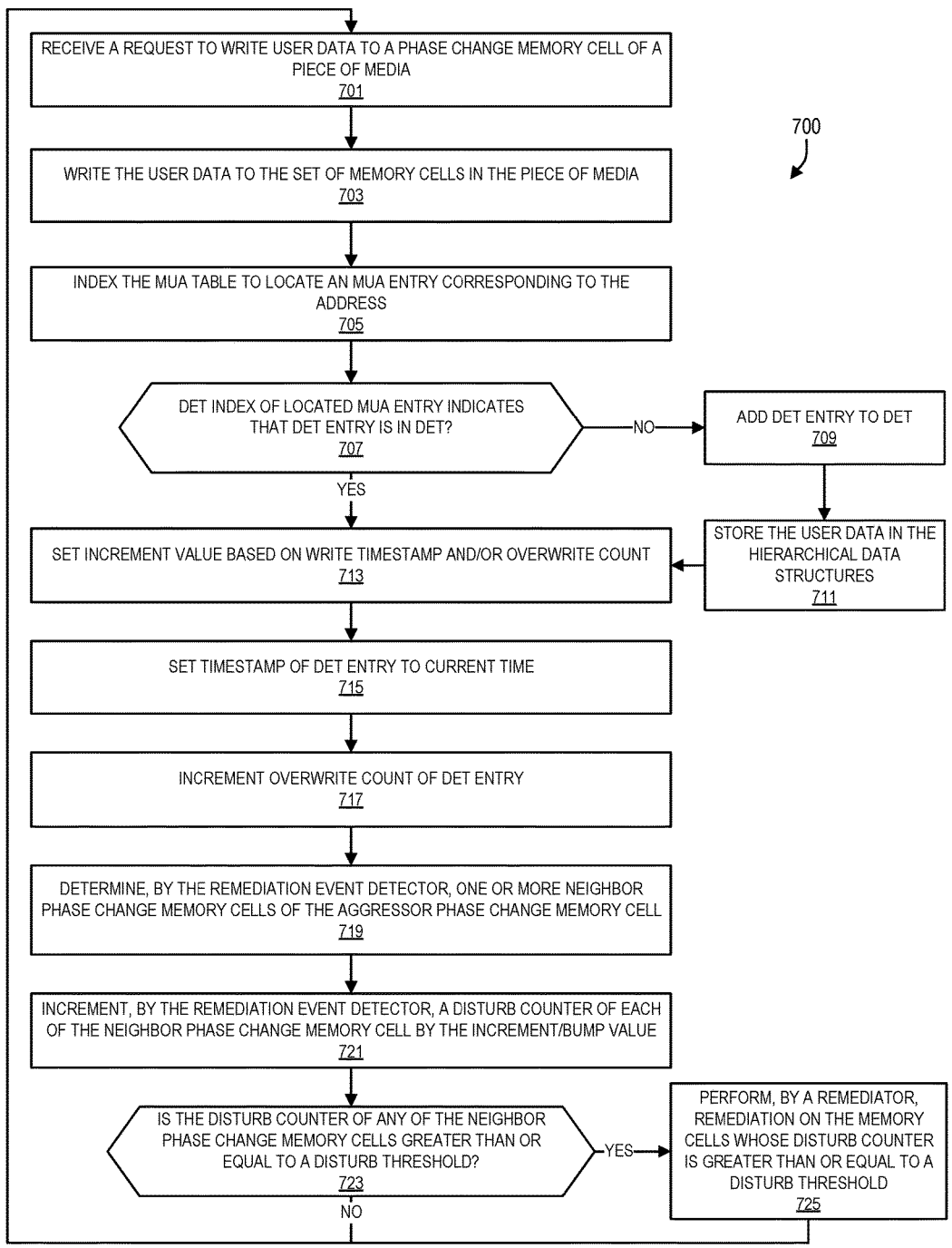
FIG. 7 shows a method for writing user data to phase change memory cells and determining when these writes have caused disturbances to neighbor phase change memory cells that warrant remediation, in accordance with one or more embodiments.

Turning now to FIG. 7, a method 700 according to one embodiment will be described for writing user data to phase change memory cells 200 and determining when these writes cause disturbances to neighbor phase change memory cells 200 that warrant remediation. The operations in FIG. 7 will be described with reference to the exemplary implementations of the other figures. However, it should be understood that the operations of the diagram can be performed by implementations other than those discussed with reference to the other figures, and the implementations discussed with reference to these other figures can perform operations different than those discussed with reference to the diagram. Although described and shown in FIG. 7 in a particular order, the operations of the method 700 are not restricted to this order. For example, one or more of the operations of the method 700 may be performed in a different order or in partially or fully overlapping time periods. Accordingly, the description and depiction of the method 700 is for illustrative purposes and is not intended to restrict to a particular implementation.

Each operation of the method 700 can be performed by one or more components of the computing system 100 (e.g., the processing device 108 of the controller 104). For example, in some embodiments, the operations of the method 700 are performed by the drift management system 116 using the set of hierarchical data structures 400, the remediation event detector 118 using the set of hierarchical data structures 400, and/or the remediator 120.

Although the method 700 will be described in relation to a single write of user data 419, the drift management system 116, the remediation event detector 118, and/or the remediator 120 can perform the operations of the method 700 simultaneously/concurrently for multiple writes of user data 419. Accordingly, since the hierarchical data structures 400 are first-in-first-out structures with corresponding size limits, the drift management system 116 can cause the hierarchical data structures 400 to remove corresponding entries/data as the controller 104 processes new writes of user data 419.

The method 700 commences at operation 701 with the a processor/processing device receiving a request to write user data 419 to a set of phase change memory cells 200 of a piece/portion of media (e.g., the piece of media is a memory device 106). The request may include an address for writing the user data 419. In one embodiment, the request is received from the host system 112 and the controller 104 receives the request via the host interface 114. For example, using the memory device $106_1$ shown in FIG. 3, the controller 104 receives a request to write user data 419 to the phase change memory cell 200A at operation 701. For purposes of illustration, the writing of user data 419 to the phase change memory cell 200A will be used hereinafter to explain the method 700.

At operation 703, a processor/processing device writes the user data 419 to the set of phase change memory cells 200. In particular, the processor/processing device writes the user data 419 to the set of phase change memory cells 200 by changing the phases of corresponding variable resistance materials 203 of the set of phase change memory cells 200 to represent the user data 419. Using the example above, the controller 104 writes user data 419 to the phase change memory cell 200A at operation 703.

At operation 705, the drift management system 116 or another component of the memory system 102 indexes the MUA table 401 to locate an MUA entry 403 corresponding to the address of the set of phase change memory cells 200. As noted above, the MUA entry 403 can include a DET index 403A and/or a disturb counter 403B. The DET index 403A, when present or populated, indicates a DET entry 413 in the DET 405 corresponding to the MUA entry 403 while the disturb counter 403B indicates the level/degree of disturbance experienced by an associated phase change memory cell 200. When the drift management system 116 determines at operation 707 that the DET index 403A indicates that an DET entry 413 for the MUA entry 403 is not present in the DET 405, the drift management system 116 adds a DET entry 413 to the DET 405 at operation 709. Adding the DET entry 413 to the DET 405 may include the drift management system 116 updating the DET index 403A to reference the newly added DET entry 413 in the DET 405.

At operation 711, the drift management system 116 stores/buffers/caches the user data 419 in the hierarchical data structures 400 for access during later read operations. In particular, the user data 419 may be added to the DDB 421. Storing the user data 419 in the hierarchical data structures 400 allows low-latency and error free retrieval/reading of the user data 419 while the phase change memory cells 200 are undergoing rapid resistivity drift. Namely, the user data 419 can be read from the hierarchical data structures 400 (e.g., the DDB 421) instead of the phase change memory cells 200 while the phase change memory cells 200 are difficult to read based on their rapid resistivity change. Since the hierarchical data structures 400 (e.g., the DDB 421) are not phase change memory cells, they do not suffer from resistivity drift issues. As noted above, the hierarchical data structures 400 may be first-in-first-out structures. In this configuration, the drift management system 116 replaces user data 419 after the occurrence of an event (e.g., after passage of a period of time (e.g., one-hundred milliseconds since the user data 419 was written to the memory devices $106_1$-$106_N$) or one or more of the hierarchical data structure(s) reaching capacity (e.g., the DDB 421 reaching capacity)).

Figure 8:
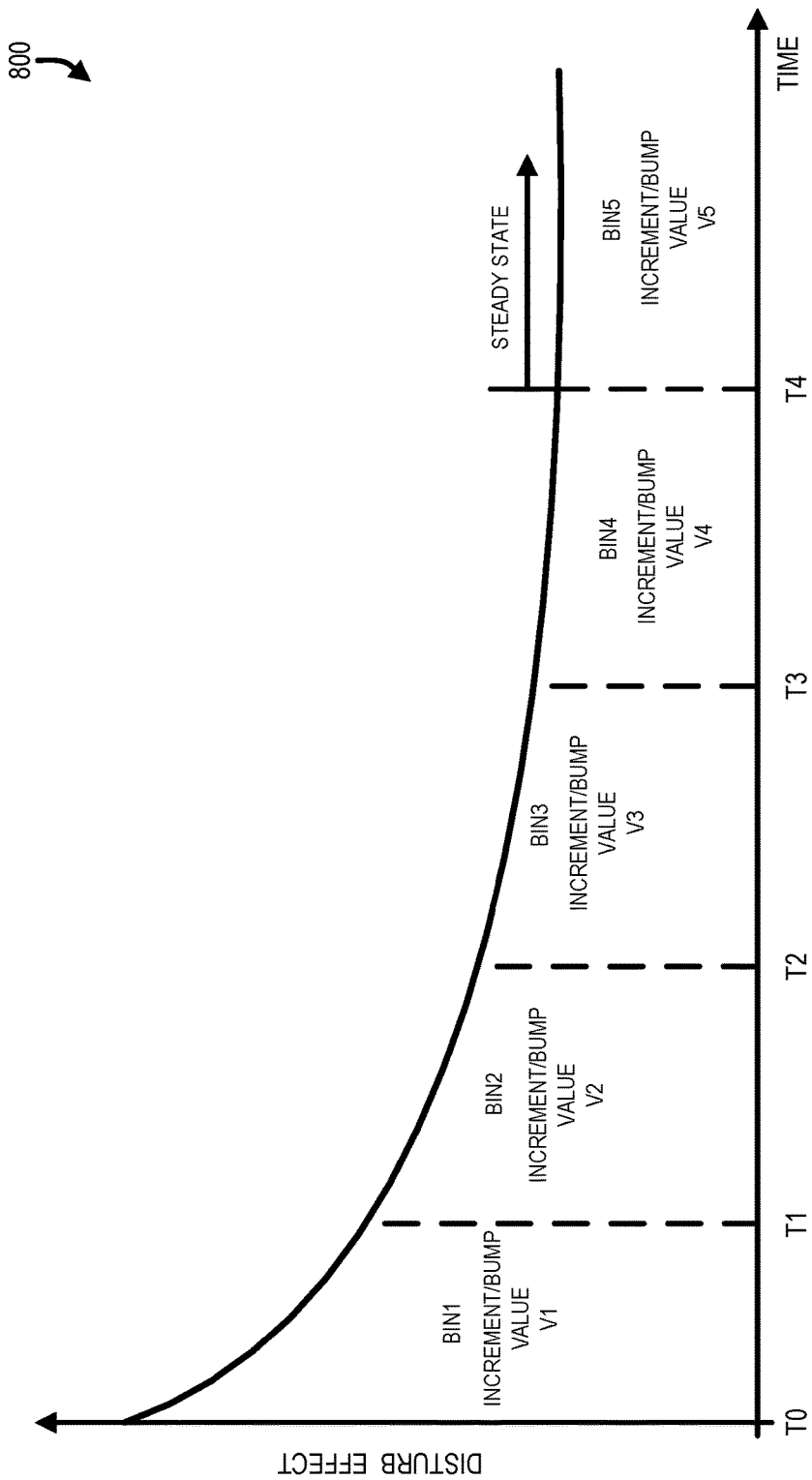
FIG. 8 shows a graph of increment/bump values relative to time values, in accordance with one or more embodiments.

At operation 713, the remediation event detector 118 sets an increment/bump level. In one embodiment, the increment/bump value is set based on the write timestamp 413C and/or the overwrite count 413D for the DET entry 413 located at operation 707 or added at operation 709. For example, FIG. 8 shows a graph 800 of increment/bump values relative to ranges of times that are organized into bins. In particular, each of the time values T0-T4 represent time differences between the current time and write timestamps 413C. As shown, when the difference between the current time and a write timestamp 413C is between time T0 and time T1 (i.e., BIN1), the increment/bump value is set to a first value V1. When the difference between the current time and a write timestamp 413C is between time T1 and time T2 (i.e., BIN2), the increment/bump value is set to a second value V2. When the difference between the current time and a write timestamp 413C is between time T2 and time T3 (i.e., BIN3), the increment/bump value is set to a second value V3. When the difference between the current time and a write timestamp 413C is between time T3 and time T4 (i.e., BIN4), the increment/bump value is set to a fourth value V4. When the difference between the current time and a write timestamp 413C is greater than time T4 (i.e., BIN5), the increment/bump value is set to a fifth value V5 (i.e., a default/steady state value). In this example, the time values T0-T4 may be any values. For example, time T0 may be equal to zero-milliseconds, time T1 may be equal to one-hundred milliseconds, time T2 may be equal to two-hundred milliseconds, time T3 may be equal to three-hundred milliseconds, and time T4 may be equal to four-hundred milliseconds. Although shown as the time values T0-T4 being uniformly separated/distributed, the time values T0-T4 may be selected with any values and any uniform or non-uniform separation/distribution.

In one embodiment, the values V1-V5 are progressively smaller such that increment/bump value V1 is greater than increment/bump value V2, increment/bump value V2 is greater than increment/bump value V3, increment/bump value V3 is greater than increment/bump value V4, and increment/bump value V4 is greater than increment/bump value V5. This relationship demonstrates that as the difference between the current time and a write timestamp 413C increases (i.e., moving right on the time axis), the disturb effect to neighbor phase change memory cells 200 decreases (i.e., moving down on the disturb effect axis). Conversely, as the difference between the current time and a write timestamp 413C decreases (i.e., moving left on the time axis), the disturb effect to neighbor phase change memory cells 200 increases (i.e., moving up on the disturb effect axis). In particular, as writes to phase change memory cells 200 become more frequent (i.e., the difference between the current time and a write timestamp 413C decreases), the disturb effect to neighbor phase change memory cells 200 increases. Specifically, heat/thermal energy from a write to an aggressor phase change memory cell 200, which dissipates to and accumulates on neighbor phase change memory cells 200, is not allowed to decrease/cool before another write is performed to the aggressor phase change memory cell 200 that causes more heat/thermal energy to accumulate. Accordingly, as the difference between the current time and a write timestamp 413C decreases, the increment/bump value, which will be used to adjust the disturb counter 403B of neighbor phase change memory cells 200, increases (i.e., to represent the increased disturbance).

As shown in FIG. 8, as the difference between the current time and a write timestamp 413C passes time T5, the disturb effect experienced by neighbor phase change memory cells 200 based on writes to aggressor phase change memory cells 200 enters a steady state corresponding to the increment/bump value V5. This increment/bump value V5 may be used in two situations: (1) when, as noted above, the difference between the current time and a write timestamp 413C passes time T4 and (2) when the write timestamp 413C has not yet been set (e.g., when the DET entry 413 is newly added to the DET 405). For example, in addition to the performance of operation 711, the remediation event detector 118 sets the increment/bump level to the value V5 at operation 713 since a DET entry 413 is being added to the DET 405 at operation 709. In contrast, when the drift management system 116 determines at operation 707 that the DET index 403A indicates that an DET entry 413 for the MUA entry 403 is present in the DET 405, the remediation event detector 118 uses the difference between the current time and the write timestamp 413C of the DET entry 413 to identify a value V1-V5 in the graph 800 of FIG. 8 to set the increment/bump value at operation 713.

As noted above, in addition to or in lieu of using the write timestamp 413C to set the increment/bump value, the remediation event detector 118 may also use the overwrite count 413D to set the increment/bump value at operation 713. In particular, repeated writes to a particular phase change memory cell 200 may form hotspots that may add to the disturb effect experienced by neighbor phase change memory cells 200. Accordingly, as the overwrite count 413D increases, the increment/bump value set at operation 713 may increase. In one embodiment, in which both the write timestamp 413C and the overwrite count 413D are used to set the increment/bump value at operation 713, the overwrite count 413D may be used as a multiplier for the values V1-V5 obtained from using the write timestamp 413C together with the graph 800 of FIG. 8. For example, when the difference between the current time and the write timestamp 413C falls within BIN2, the value V2 may be multiplied by the overwrite count 413D to produce the increment/bump value. When the remediation event detector 118 sets the increment/bump value at operation 713 based on a new DET entry 413 for which an overwrite count 413D has not been set, the overwrite count 413D does not affect the remediation event detector 118 setting the increment/bump value at operation 713.

Although described as the overwrite count 413D being used to directly multiply the values V1-V5 obtained from using the write timestamp 413C together with the graph 800 of FIG. 8, in other embodiments, the overwrite count 413D may be mapped to value that is used for multiplying with the value V1-V5 obtained from using the write timestamp 413C together with the graph 800 of FIG. 8. For example, when the overwrite count 413D is in a first range (e.g., between 0-3), a first multiplier value may be used. When the overwrite count 413D is in a second range (e.g., between 4-7), a first multiplier value may be used. In another embodiment, the overwrite count 413D maps to an amount to add to the increment/bump value.

At operation 713, the remediation event detector 118 sets the write timestamp 413C of the DET entry 413 identified at operation 707 or added to the DET 405 at operation 709 equal to the current time. Similarly, at operation 715, the remediation event detector 118 increments the overwrite count 413D of the DET entry 413 identified at operation 707 or added to the DET 405 at operation 709 by one. Setting the write timestamp 413C equal to the current time and incrementing the overwrite count 413D prepares the DET entry 413 for a future remediation analysis using the method 700.

At operation 719, the remediation event detector 118 determines a set of neighbor phase change memory cells 200 relative to the aggressor phase change memory cell 200A (i.e., one or more neighbor phase change memory cells 200). In one embodiment, determining a set of neighbor phase change memory cells 200 relative to an aggressor memory cell 200 may be performed based on an address of the neighbor phase change memory cells 200 and a known configuration of a memory device 106 (i.e., offsets in relation to neighbor phase change memory cells 200). As described above, a phase change memory cell 200 is considered a neighbor to another phase change memory cell 200 when the phase change memory cells 200 are directly adjacent and/or no phase change memory cells 200 separate the two phase change memory cells 200 on a portion of media (e.g., a memory device 106). As described in relation to FIG. 3, the remediation event detector 118 determines at operation 719 that the phase change memory cells 200B-200E to be neighbor phase change memory cells 200 to the aggressor phase change memory cell 200A, as the phase change memory cells 200B-200E are directly adjacent to the phase change memory cell 200A and no phase change memory cells 200 separate each of the phase change memory cells 200B-200E and the aggressor phase change memory cell 200A in the memory device $106_1$.

At operation 721, the remediation event detector 118 increments a disturb counter for each of the neighbor phase change memory cells 200B-200E by the increment/bump value set at operation 713. In one embodiment, the disturb counter for each neighbor phase change memory cell 200B-200E may be located in the MUA table 401. For example, as shown in FIG. 4, the disturb counter 403B may be located in MUA entries 403. Although disturb counters 403B are shown in the data structures 400, in alternative embodiments, the disturb counters 403B for each phase change memory cell 200 can be located at any location in the memory system 102 or otherwise accessible to the memory system 102.

At operation 723, the remediation event detector 118 determines whether the disturb counter 403B for each neighbor phase change memory cell 200B-200E is greater than or equal to a disturb threshold. The disturb threshold indicates a level of disruption that the current or another write to the aggressor phase change memory cell 200 will likely cause the value of a phase change memory cell 200 to be unreadable or the phase of the phase change memory cell 200 to be altered (i.e., change from an amorphous phase to a crystalline phase or from a crystalline phase to an amorphous phase).

Upon determining at operation 723 that a disturb counter 403B of one or more of the neighbor phase change memory cells 200B-200E is greater than or equal to the disturb threshold, the method 700 may move to operation 725. At operation 725, the remediator 120 performs remediation on one or more of the neighbor phase change memory cells 200B-200E whose disturb counter 403B is greater than or equal to the disturb threshold.

In one embodiment, the remediator 120 rewrites the one or more of the neighbor phase change memory cells 200B-200E whose disturb counter 403B is greater than or equal to the disturb threshold at operation 725. Rewriting nullifies any disturbances encountered by the one or more of the neighbor phase change memory cells 200B-200E as a result of writes from aggressor phase change memory cells 200. Accordingly, in this embodiment, the remediator 120 also resets the disturb counter 403B for the one or more of the neighbor phase change memory cells 200B-200E following the rewrite(s).

In another embodiment, the remediator 120 performs a selective remediation at operation 725 on the one or more of the neighbor phase change memory cells 200B-200E whose disturb counters 403B are greater than or equal to the disturb threshold. In this embodiment, the remediator 120 reads the one or more of the neighbor phase change memory cells 200B-200E and determines the level of disturbance actually encountered by these phase change memory cells 200B-200E (i.e., determines whether values in the neighbor phase change memory cells 200B-200E are readable). In particular, the disturb counter 403B associated with a phase change memory cell 200 is an estimate of the level of disturbance experienced by the phase change memory cell 200 as a result of writes to one or more aggressor phase change memory cells 200. However, this disturbance estimate can be inaccurate as to the actual level of disturbance experienced by the phase change memory cell 200. Accordingly, by reading the one or more neighbor phase change memory cells 200B-200E, the remediator 120 can use error detection determine whether rewriting the one or more neighbor phase change memory cells 200B-200E is necessary. In one embodiment, reading the one or more neighbor phase change memory cells 200B-200E includes reading a codeword of which the one or more neighbor/victim phase change memory cells 200B-200E are a part. In this embodiment, each of the one or more neighbor phase change memory cells 200B-200E are part of separate codewords. Using parity bits associated with the codewords, the remediator 120 determines the level of disturbance experienced by the one or more neighbor phase change memory cells 200B-200E (e.g., the number of bits for which an error was detected). Upon the remediator 120 detecting a high level of disturbance, the remediator 120 rewrites the phase change memory cell 200B-200E and reset the associated disturb counters 403B as described above.

Following operation 723 or operation 725, the method 700 returns to operation 701 for the drift management system 116 to detect/receive another request to write user data 419 to a set of phase change memory cells 200. While illustrated as a loop, in one embodiment, the processor/processing device executes multiple instances of the method 700 concurrently. As described above, via the method 700, the remediation event detector 118 and the remediator 120 provide remediation services to phase change memory cells 200 with efficient use of resources. In particular, the remediation event detector 118 may utilize a set of hierarchical data structures 400 that selectively maintains pieces of data for determining when remediation is warranted for phase change memory cells 200. Specifically, the DET 405 includes write timestamps 413C and/or overwrite counts 413D for phase change memory cells 200 that were recently written (e.g., assuming one gigabit per second write rates, the DET 405 will include entries for addresses written during the last four-hundred milliseconds and older writes will no longer be stored in the DET 405). Accordingly, resources are not devoted to storing write timestamps 413C and/or overwrite counts 413D for each phase change memory cell 200, while still maintaining accurate disturb counters 403B for each phase change memory cell 200. Further, the above described set of hierarchical data structures 400 may additionally be used for improving read performance while phase change memory cells 200 are undergoing rapid resistivity drift. This dual use of the set of hierarchical data structures 400 further improves efficiency of resources.

It will be apparent from this description that aspects of the disclosure may be embodied, at least in part, in software or firmware. That is, a computer system or other data processing system (e.g., the drift management system 116, the remediation event detector 118, and/or the remediator 120 of the controller 104) may carry out the computer-implemented method 700 in response to its processor or other circuitry executing sequences of instructions contained in local memory/storage 110 or another non-transitory machine-readable storage medium. The software may further be transmitted or received over a network (not shown) via a network interface. In various embodiments, hardwired circuitry may be used in combination with the software instructions to implement the present embodiments. It will also be appreciated that additional components, not shown, may also be part of computing system 100, and, in some embodiments, fewer components than that shown in FIG. 1 may also be used in computing system 100.

An article of manufacture may be used to store program code providing at least some of the functionality of the embodiments described above. Additionally, an article of manufacture may be used to store program code created using at least some of the functionality of the embodiments described above. An article of manufacture that stores program code may be embodied as, but is not limited to, one or more memories (e.g., one or more flash memories, random access memories—static, dynamic, or other), optical disks, CD-ROMs, DVD-ROMs, EPROMs, EEPROMs, magnetic or optical cards or other type of non-transitory machine-readable media suitable for storing electronic instructions. Additionally, embodiments of the invention may be implemented in, but not limited to, hardware or firmware utilizing an FPGA, ASIC, a processor, a computer, or a computer system including a network. Modules and components of hardware or software implementations can be divided or combined without significantly altering embodiments of the invention.

In the following description and claims, the terms "coupled" and "connected," along with their derivatives, may be used. It should be understood that these terms are not intended as synonyms for each other. "Coupled" is used to indicate that two or more elements, which may or may not be in direct physical or electrical contact with each other, co-operate or interact with each other. "Connected" is used to indicate the establishment of communication between two or more elements that are coupled with each other.

In the foregoing specification, the invention has been described with reference to specific exemplary embodiments thereof. Various embodiments and aspects of the invention(s) are described with reference to details discussed in this document, and the accompanying drawings illustrate the various embodiments. The description above and drawings are illustrative of the invention and are not to be construed as limiting the invention. References in the specification to "one embodiment," "an embodiment," "an exemplary embodiment," etc., indicate that the embodiment described may include a particular feature, structure, or characteristic, but not every embodiment may necessarily include the particular feature, structure, or characteristic. Moreover, such phrases are not necessarily referring to the same embodiment. Furthermore, when a particular feature, structure, or characteristic is described in connection with an embodiment, such feature, structure, or characteristic may be implemented in connection with other embodiments whether or not explicitly described. Additionally, as used in this document, the term "exemplary" refers to embodiments that serve as simply an example or illustration. The use of exemplary should not be construed as an indication of preferred examples. Blocks with dashed borders (e.g., large dashes, small dashes, dot-dash, dots) are used to illustrate optional operations that add additional features to embodiments of the invention. However, such notation should not be taken to mean that these are the only options or optional operations, and/or that blocks with solid borders are not optional in some embodiments of the invention. Numerous specific details are described to provide a thorough understanding of various embodiments of the present invention. However, in certain instances, well-known or conventional details are not described in order to provide a concise discussion of embodiments of the present inventions.

It will be evident that various modifications may be made thereto without departing from the broader spirit and scope of the invention as set forth in the following claims. For example, the methods described in this document may be performed with fewer or more features/blocks or the features/blocks may be performed in differing orders. Additionally, the method(s) described in this document may be repeated or performed in parallel with one another or in parallel with different instances of the same or similar methods. While examples refer to memory and non-volatile storage media, embodiments may also be implemented with other types of storage media.

What is claimed is:

1. A computer-implemented method for remediating memory cells, comprising:
   writing user data to an aggressor memory cell;
   locating a first entry for the aggressor memory cell in a first data structure, wherein the first data structure includes entries for each memory cell in a first set of memory cells, including a neighbor memory cell of the aggressor memory cell and the aggressor memory cell, and each entry in the first data structure includes a disturb counter corresponding to an associated memory cell;
   determining, based on the first entry, whether a second data structure includes a second entry corresponding to the aggressor memory cell, wherein the second data structure includes entries for a second set of memory cells written during a first time period, wherein the second set of memory cells is a subset of the first set of memory cells and wherein each entry in the second data structure includes a write timestamp and overwrite count corresponding to an associated memory cell;
   determining, based on the second entry, one or more of a write timestamp and an overwrite count associated with the aggressor memory cell, wherein the write timestamp indicates a last write to the aggressor memory cell and the overwrite count indicates the number of writes to the aggressor memory cell during a time period;
   determining, based on one or more of the write timestamp and the overwrite count, an increment value of a disturb counter associated with the neighbor memory cell;
   incrementing, in response to the write, the disturb counter associated with the neighbor memory cell based on the increment value; and
   performing, in response to the disturb counter being greater than or equal to a disturb threshold, remediation for the neighbor memory cell.

2. The computer-implemented method of claim 1, wherein the aggressor memory cell and the neighbor memory cell are directly adjacent on a memory device.

3. The computer-implemented method of claim 1, wherein the determining the increment value comprises:
   determining a difference between a current time and the write timestamp;
   comparing the difference with a plurality of ranges, wherein each range in the plurality of ranges corresponds to a value; and
   setting the increment value to a value of a range in the set of ranges within which the difference falls.

4. The computer-implemented method of claim 3, wherein the determining the increment value further comprises:
   mapping the overwrite count to a multiplier value; and
   multiplying the increment value by the multiplier value.

5. The computer-implemented method of claim 1, wherein each entry in the second data structure includes a flag that indicates whether user data of a corresponding memory cell is buffered in a third data structure,
   wherein the third data structure buffers user data for a third set of memory cells written during a second time period,
   wherein the second time period is a subset of the first time period and the third set of memory cells is a subset of the second set of memory cells.

6. The computer-implemented method of claim 1, wherein the aggressor memory cell and the neighbor memory cell are phase change memory cells, and
   wherein writes to the aggressor memory cell dissipate heat to the neighbor memory cell.

7. The computer-implemented method of claim 1, wherein the performing remediation comprises:
   determining whether errors experienced by the neighbor memory cell are greater than or equal to a threshold value;
   rewriting, in response to determining that the errors experienced by the neighbor memory cell are greater than or equal to the threshold value, data to the neighbor memory cell; and
   resetting, in response to rewriting data to the neighbor memory cell, the disturb counter associated with the neighbor memory cell.

8. A non-transitory machine-readable storage medium, which stores instructions that, when executed by a processor, cause the processor to:
   write user data to an aggressor memory cell;
   locate a first entry for the aggressor memory cell in a first data structure, wherein the first data structure includes entries for each memory cell in a first set of memory cells, including a neighbor memory cell of the aggressor memory cell and the aggressor memory cell, and each entry in the first data structure includes a disturb counter corresponding to an associated memory cell;
   determine, based on the first entry, whether a second data structure includes a second entry corresponding to the aggressor memory cell, wherein the second data structure includes entries for a second set of memory cells written during a first time period, wherein the second set of memory cells is a subset of the first set of memory cells and wherein each entry in the second data structure includes a write timestamp and overwrite count corresponding to an associated memory cell;
   determine, based on the second entry, one or more of a write timestamp and an overwrite count associated with the aggressor memory cell, wherein the write timestamp indicates a last write to the aggressor memory cell and the overwrite count indicates the number of writes to the aggressor memory cell during a time period;
   determine, based on one or more of the write timestamp and the overwrite count, an increment value of a disturb counter associated with the neighbor memory cell;
   increment, in response to the write, the disturb counter associated with the neighbor memory cell based on the increment value; and
   perform, in response to the disturb counter being greater than or equal to a disturb threshold, remediation for the neighbor memory cell.

9. The non-transitory machine-readable storage medium of claim 8, wherein the aggressor memory cell and the neighbor memory cell are directly adjacent on a memory device.

10. The non-transitory machine-readable storage medium of claim 8, wherein the determining the increment value comprises:
    determining a difference between a current time and the write timestamp;
    comparing the difference with a plurality of ranges, wherein each range in the plurality of ranges corresponds to a value; and
    setting the increment value to a value of a range in the set of ranges within which the difference falls.

11. The non-transitory machine-readable storage medium of claim 10, wherein the determining the increment value further comprises:
    mapping the overwrite count to a multiplier value; and
    multiplying the increment value by the multiplier value.

12. The non-transitory machine-readable storage medium of claim 8, wherein each entry in the second data structure includes a flag that indicates whether user data of a corresponding memory cell is buffered in a third data structure,
    wherein the third data structure buffers user data for a third set of memory cells written during a second time period,
    wherein the second time period is a subset of the first time period and the third set of memory cells is a subset of the second set of memory cells.

13. The non-transitory machine-readable storage medium of claim 8, wherein the aggressor memory cell and the neighbor memory cell are phase change memory cells, and
    wherein writes to the aggressor memory cell dissipate heat to the neighbor memory cell.

14. The non-transitory machine-readable storage medium of claim 8, wherein the performing remediation comprises:
    determining whether errors experienced by the neighbor memory cell are greater than or equal to a threshold value;
    rewriting, in response to determining that the errors experienced by the neighbor memory cell are greater than or equal to the threshold value, data to the neighbor memory cell; and
    resetting, in response to rewriting data to the neighbor memory cell, the disturb counter associated with the neighbor memory cell.

15. A system comprising:
    a memory device comprising a first memory cell and a second memory cell, wherein the second memory cell is a neighbor of the first memory cell in the memory device; and
    a processor, coupled to the memory device, the processor to write user data to the first memory cell and to:

locate a first entry for the first memory cell in a first data structure, wherein the first data structure includes entries for each memory cell in a first set of memory cells, including the second memory cell and the first memory cell, and each entry in the first data structure includes a disturb counter corresponding to an associated memory cell, determine, based on the first entry, whether a second data structure includes a second entry corresponding to the first memory cell, wherein the second data structure includes entries for a second set of memory cells written during a first time period, wherein the second set of memory cells is a subset of the first set of memory cells and wherein each entry in the second data structure includes a write timestamp and overwrite count corresponding to an associated memory cell, determine, based on the second entry, one or more of a write timestamp and an overwrite count associated with the first memory cell, wherein the write timestamp indicates a last write to the first memory cell and the overwrite count indicates the number of writes to the first memory cell during a time period, determine, based on one or more of the write timestamp and the overwrite count, an increment value of a disturb counter associated with the second memory cell, increment, in response to the write, the disturb counter associated with the second memory cell based on the increment value, and perform, in response to the disturb counter being greater than or equal to a disturb threshold, remediation for the second memory cell.

16. The system of claim 15, wherein the first memory cell and the second memory cell are directly adjacent on the memory device.

17. The system of claim 15, wherein the determining the increment value comprises:

determining a difference between a current time and the write timestamp;

comparing the difference with a plurality of ranges, wherein each range in the plurality of ranges corresponds to a value; and setting the increment value to a value of a range in the set of ranges within which the difference falls.

18. The system of claim 17, wherein the determining the increment value further comprises:

mapping the overwrite count to a multiplier value; and multiplying the increment value by the multiplier value.

\* \* \* \* \*